(12) United States Patent
Sugane et al.

(10) Patent No.: US 8,102,660 B2
(45) Date of Patent: Jan. 24, 2012

(54) MULTI-LAYER PRINTED WIRING BOARD, ELECTRONIC DEVICE, AND FABRICATION METHOD OF ELECTRONIC DEVICE

(75) Inventors: Mitsuhiko Sugane, Kawasaki (JP); Kazuya Nishida, Kawasaki (JP); Akira Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 471 days.

(21) Appl. No.: 12/343,563

(22) Filed: Dec. 24, 2008

(65) Prior Publication Data

US 2009/0279273 A1 Nov. 12, 2009

(30) Foreign Application Priority Data

May 12, 2008 (JP) ................. 2008-124723

(51) Int. Cl.
*H05K 1/00* (2006.01)
(52) U.S. Cl. ...................... 361/749; 361/795
(58) Field of Classification Search .............. 174/254, 174/255, 260, 378; 29/840, 829; 361/749, 361/795
See application file for complete search history.

(56) References Cited

U.S. PATENT DOCUMENTS

| | | | | |
|---|---|---|---|---|
| 6,288,343 B1 * | 9/2001 | Ahn et al. | ...................... | 174/254 |
| 6,444,921 B1 * | 9/2002 | Wang et al. | ................... | 174/260 |
| 2009/0188712 A1 * | 7/2009 | Clark et al. | ................... | 174/378 |

FOREIGN PATENT DOCUMENTS

| | | |
|---|---|---|
| EP | 1 768 470 A1 | 3/2007 |
| JP | 6-320671 A | 11/1994 |
| JP | 2002-517898 A | 6/2002 |
| JP | 2005-353827 A | 12/2005 |
| TW | I260359 B | 8/2006 |
| WO | 99/63552 A1 | 12/1999 |

OTHER PUBLICATIONS

Foreign Associate letter dated Oct. 20, 2011, summarizing Taiwanese Office Action dated Sep. 27, 2011, issued in corresponding Taiwanese Patent Application No. 97150046.
Taiwanese Office Action dated Sep. 27, 2011, issued in corresponding Taiwanese Patent Application No. 97150046.

* cited by examiner

*Primary Examiner* — Yuriy Semenenko
(74) *Attorney, Agent, or Firm* — Westerman, Hattori, Daniels & Adrian, LLP

(57) ABSTRACT

There is provided a multi-layer printed wiring board that can perform impedance control, concurrently maintaining the flexibility of a flexible portion with one or more signal lines. Such a multi-layer printed wiring board includes a plurality of rigid board units; and a flexible board unit, connecting outer layers or inner layers of the plurality of rigid board units and extending over the outer layers or the inner layers of the plurality of rigid board units. The flexible board unit includes a signal layer sending signals between the plurality of rigid board units; ground layers sandwiching the signal layer; and intermediate layers each interposed between the signal layer and one of the ground layers.

12 Claims, 9 Drawing Sheets

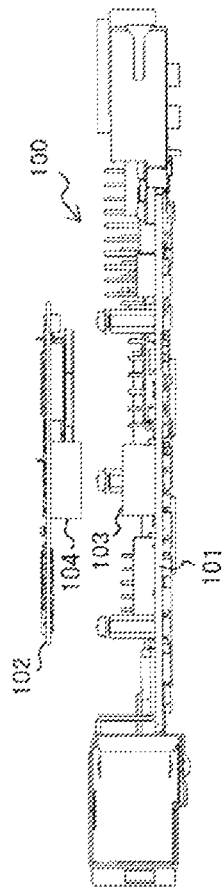
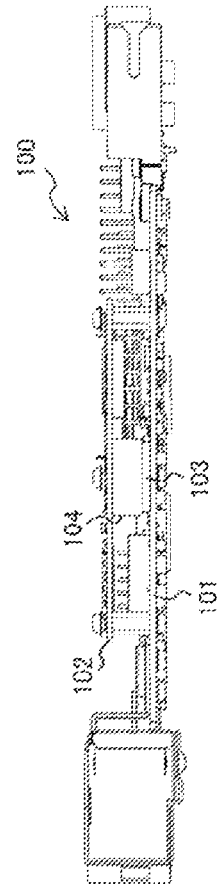
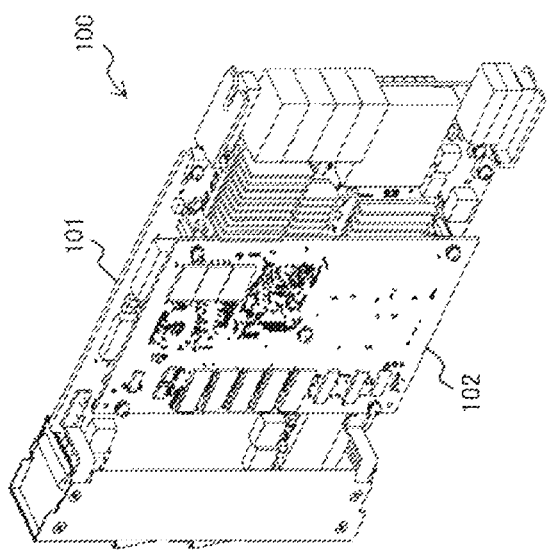
FIG. 9A
PRIOR ART
FIG. 9B
PRIOR ART
FIG. 9C
PRIOR ART

MULTI-LAYER PRINTED WIRING BOARD, ELECTRONIC DEVICE, AND FABRICATION METHOD OF ELECTRONIC DEVICE

CROSS-REFERENCE TO RELATED APPLICATION(S)

This application is based upon and claims the benefit of priority of the prior Japanese Application No. 2008-124723 filed on May 12, 2008 in Japan, the entire contents of which are incorporated by reference.

FIELD

The embodiments discussed herein are directed to a multi-layer printed wiring board including a number of multi-layer rigid wiring boards and multi-layer rigid wiring boards connecting one another to the multi-layer rigid wiring boards, and a fabrication method of such a multi-layer printed wiring board.

BACKGROUND

Conventional network systems and server systems include a number of printed wiring boards (printed boards) connected to one another for the purposes of high integration and high-speed transmission.

A method for connecting a number of printed wiring boards generally uses connectors as depicted in FIGS. 9A-9C, for example.

Specifically, as illustrated in FIG. 9A, in conventional electronic device 100, printed wiring board (main board) 101 on which parts are mounted and printed wiring board (sub board) 102 include stack connectors 103 and 104, respectively.

As illustrated in FIG. 9B, coupling of stack connectors 103 and 104 to each other communicably connects printed wiring boards 101 and 102, so that electronic device 100 shown in FIG. 9C is formed.

However, connection of printed wiring boards via connectors, such as stack connectors 103 and 104, has the following problems (1) to (4):

(1) In connector mounting, the number of pins of each connector restricts the wire connection between main board 101 and sub board 102, so that freedom in design is lowered;

(2) Connection via the connectors increases the transmission loss of signals between printed wiring boards 101 and 102;

(3) The height of electronic device 100 increases by the heights of connectors 103 and 104 to restrict the part-mounting structure of electronic device 100, making it difficult to enhancing the freedom in design and to save the space; and (4) Because space is required to install connectors 103 and 104, it is difficult to make electronic device 100 and printed wiring boards 101 and 102 higher in integration and smaller in size.

As the solution to the above problems (1) to (4), there has been provided a multi-layer rigid/flex printed board (hereinafter sometimes called multi-layer printed wiring board) formed of a number of multi-layer rigid board that are connected to one another by flexible boards on each of which circuits are formed on a flexible board made of a polyimide resin film that is a material high in flexibility (see Patent Reference 1 and 2 below, for example).

[Patent Reference 1] Japanese Patent Application Laid-Open (KOKAI) No. 2005-353827

[Patent Reference 2] Japanese Patent Application Laid-Open (KOKAI) No. HEI 6-320671

However, such a conventional multi-layer printed wiring board including a polyimide resin film reduces the flexibility in accordance with increase in the number of layers laminated for the purpose of increasing the number of signal lines.

Further, if a signal line is formed on the outermost layer or a signal line on the outermost layer is coated as the techniques disclosed in the above Patent Reference 1 and 2, impedance control that maintains the impedance of a signal through these signal lines to be constant (e.g., 50 Ω) cannot be accomplished so that signals cannot be transmitted at a high speed.

SUMMARY

According to an aspect of the embodiment, multi-layer printed wiring board includes: a plurality of rigid board units; and a flexible board unit, connecting outer layers or inner layers of the plurality of rigid board units and extending over the outer layers or the inner layers of the plurality of rigid board units, the flexible board unit including a signal layer sending signals between the plurality of rigid board units; ground layers sandwiching the signal layer; and intermediate layers each interposed between the signal layer and one of the ground layers.

Additional objects and advantages of the embodiment will be set forth in part in the description which follows, and in part will be obvious from the description, or may be learned by practice of the embodiment. The object and advantages of the embodiment will be realized and attained by means of the elements and combinations particularly pointed out in the appended claims.

It is to be understood that both the foregoing general description and the following detailed description are exemplary and explanatory only and are not restrictive of the embodiment, as claimed.

BRIEF DESCRIPTION OF THE DRAWINGS

Exemplary embodiments will be described in detail based on the following figures, wherein:

FIGS. 9A, 9B, and 9C are diagrams showing a conventional multi-layer printed wiring board, FIG. 9A being a side view in which a number of printed wiring boards serving as parts of a multi-layer printed wiring board are not connected to one another, FIG. 9B being a side view in which the same printed wiring boards are connected to one another, and FIG. 9C being a perspective view of the multi-layer printed wiring board shown in FIG. 9B.

DESCRIPTION OF THE PREFERRED EMBODIMENTS

Hereinafter, embodiments will now be described with reference to the accompanying drawings.

(a) First Embodiment

Figure 1:
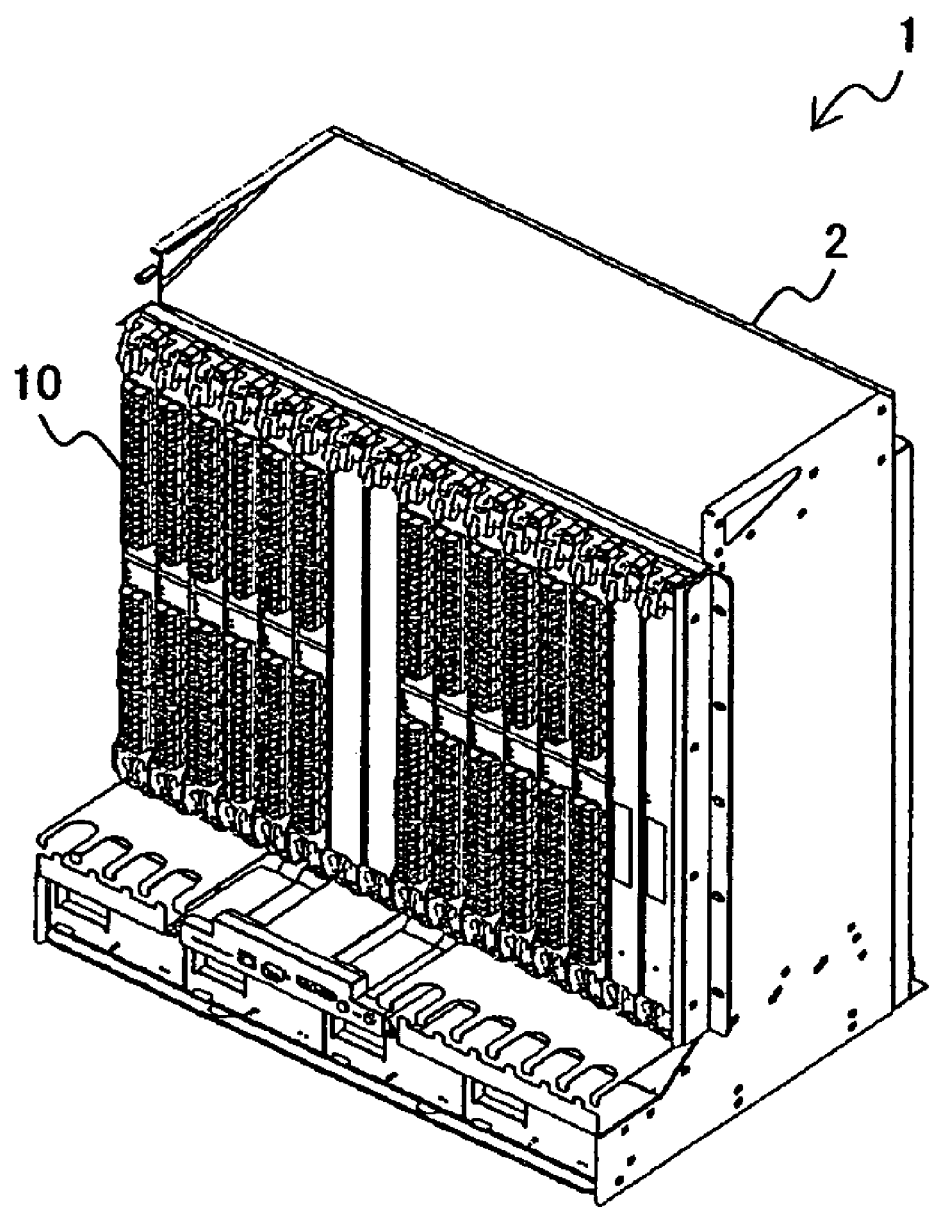
FIG. 1 is a perspective view illustrating an electronic device according to a first embodiment.

First of all, description is made in relation to electronic device 1 according to the first embodiment with reference to FIG. 1. As shown in FIG. 1, electronic device 1 includes case (main unit) 2 and a number (here, 24) of plug-in units 10. Each plug-in unit 10 can be regarded as an electronic device of the present invention.

Figure 2:
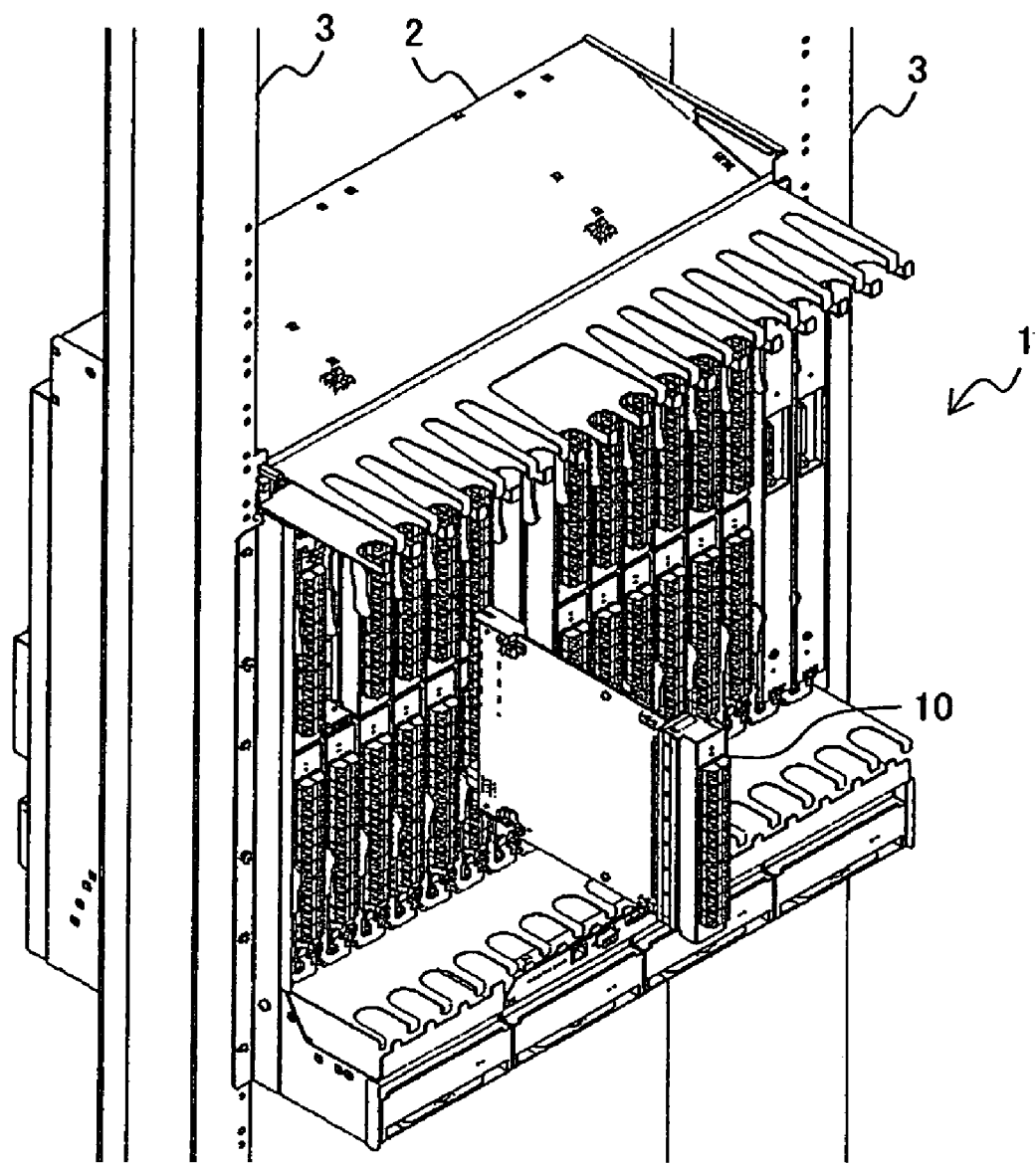
FIG. 2 is a perspective view illustrating a state in which electronic devices of the first embodiment are held in a rack.

Electronic device 1 is held in rack 3 as depicted in FIG. 2, for example.

For the sake of simplification, reference number "10" is attached to a single plug-in unit in FIGS. 1 and 2.

Figure 3A:
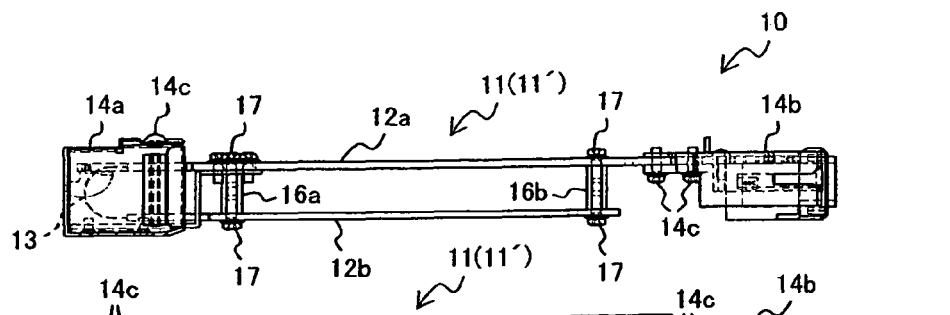
FIGS. 3A and 3B are a side view and a plane view illustrating a plug-in unit serving as an electronic device of the first embodiment, respectively.
Figure 3B:
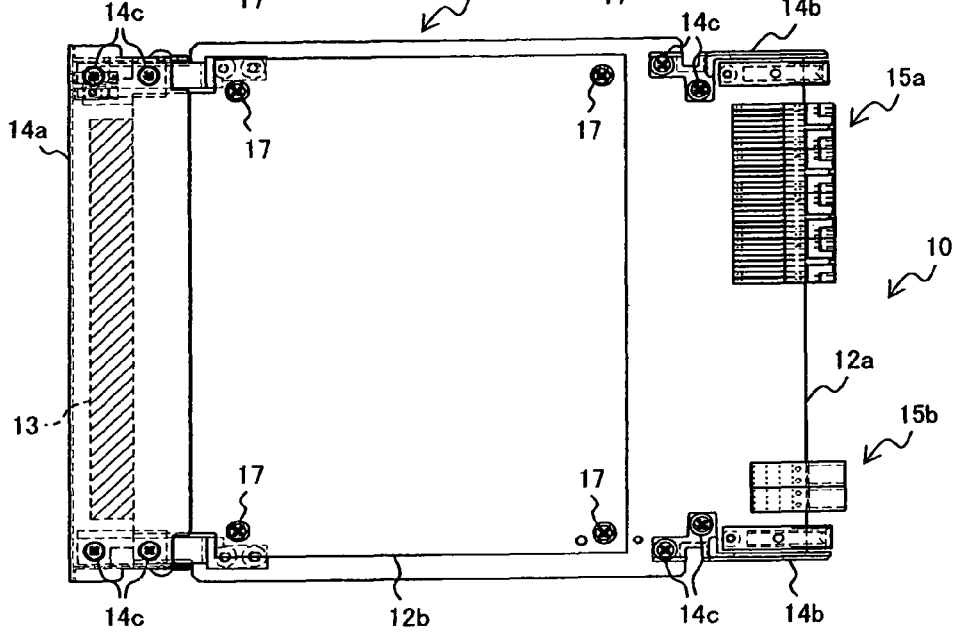

As shown in FIGS. 3A and 3B, plug-in unit 10 includes multi-layer rigid/flex printed wiring board (hereinafter called a multi-layer printed wiring board) 11 and covers 14a and 14b.

Covers 14a and 14b are coupled to multi-layer printed wiring board 11 by screws 14c.

Reference numbers 15a and 15b in FIG. 3B represent connection terminals (interfaces) mounted on multi-layer printed wiring board 11.

Multi-layer printed wiring board 11 includes two rigid board units 12a and 12b and flexible board unit 13.

As shown in FIG. 3A, rigid board units 12a and 12b of multi-layer printed wiring board 11 are coupled to each other by screws 17 via spacers 16a and 16b.

Further, flexible board unit 13 has flexibility and is in a bent state when being stored inside cover 14a.

Figure 4:
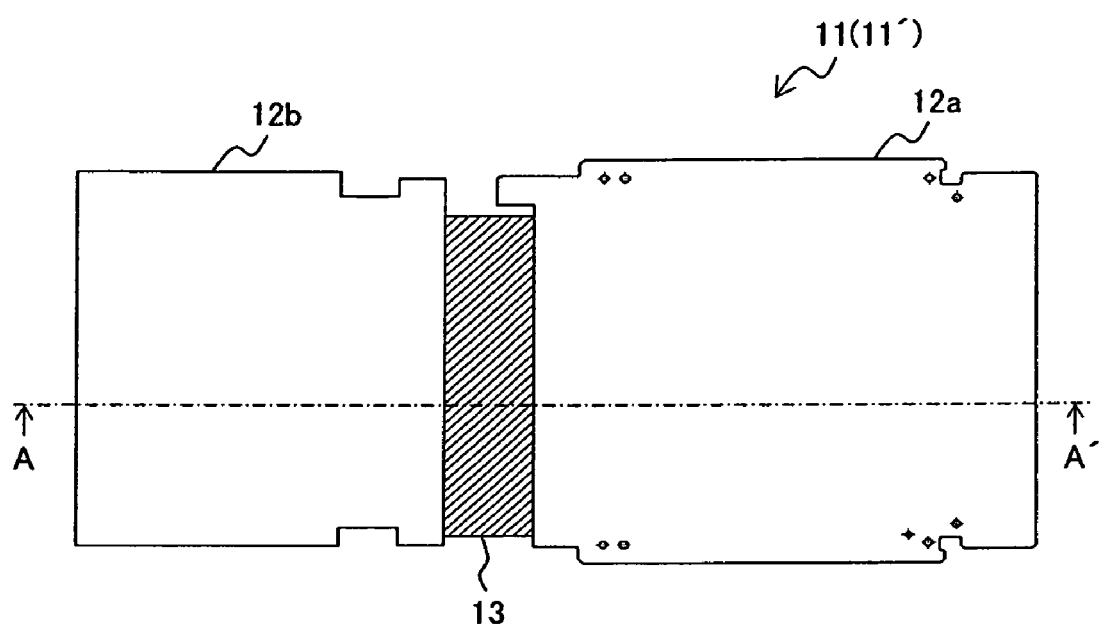
FIG. 4 is a diagram depicting a multi-layer printed wiring board according to the first embodiment.

FIG. 4 is a plane view illustrating a developed state of multi-layer printed wiring board 11. As depicted in FIG. 4, multi-layer printed wiring board 11 is formed by connecting rigid board units 12a and 12b via flexible board unit 13. For the sake of simplification, FIG. 4 omits through holes depicted in FIG. 5 detailed below.

Figure 5:
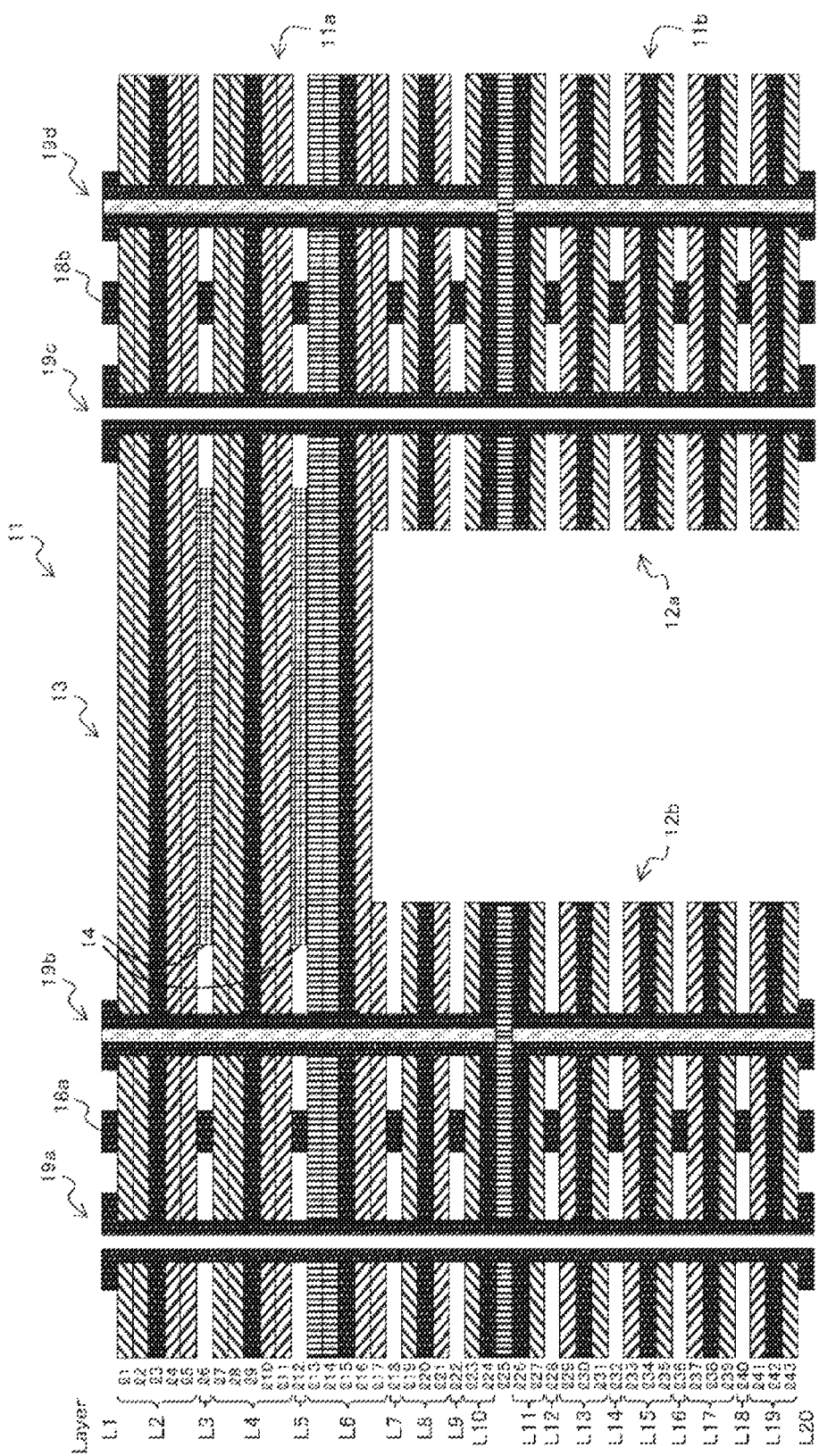
FIG. 5 is a A-A' sectional view of FIG. 4.

FIG. 5 is the A-A' sectional view of FIG. 4. FIG. 5 depicts rigid board units 12a and 12b having the same width for the sake of simplification. Layers with the same pattern represents layers made of the same or the substantially same material in FIG. 5.

As illustrated in FIG. 5, rigid board units 12a and 12b and flexible board unit 13 each have a multi-layer structures.

Each of rigid board units 12a and 12b has layers L7 through L20, and flexible board unit 13 has layers L1 through L6.

Flexible board unit 13 is arranged on the outer layers of rigid board units 12a and 12b so as to connect rigid board units 12a and 12b and so as to extend over the outer surfaces of rigid board units 12a and 12b.

Here, the structure of flexible board unit 13 will now be detailed.

Layer L1 of flexible board unit 13 is the surface layer. Layers L2, L4, and L6 of flexible board unit 13 are five-layer structures including layers 11-15, 17-111, and 113-117, respectively.

Layers L3 and L5 of flexible board unit 13 are signal layers that send signals between rigid board units 12a and 12b, and each in the form of single layer structure including layers 16 and 112, respectively. In FIG. 5, reference number 14 represents a signal line in corresponding layers L3 and L5.

Layers 13, 19, and 115 respectively in layers L2, L4, and L6 of flexible board unit 13 are non-patterned layers made of a copper foil which function as ground layers.

In flexible board unit 13, ground layers 13 and 19 sandwich signal layer L3 and ground layers 19 and 115 sandwich signal layer L5.

Further, between layers 13 and 19 sandwiching signal layer L3 and between layers 19 and 115 sandwiching signal layer L5 in flexible board unit 13, intermediate layers 14-15 and 17-18 and intermediate layers 110-111 and 113-114 are formed, respectively.

Specifically, intermediate layers 14 and 15 are formed between signal layer L3 and ground layer 13; intermediate layers 17 and 18 are formed between signal layer L3 and ground layer 19; intermediate layers 110 and 111 are formed between signal layer L5 and ground layer 19; and intermediate layers 113 and 114 are formed between signal layer L5 and ground layer 115.

On the outer surface of ground layers 13 and 115 serving as the outer surfaces of flexible board unit 13, protection layers 11-12 and protections layers 116-117 are respectively formed.

Next, description will be made in relation to the materials of layers 11-117 of flexible board unit 13.

Layers 11, 12, 14, 15, 17, 18, 110, 111, 116, and 117 of flexible board unit 13 are made of a material (epoxy resin prepreg) formed by impregnating glass cloth with epoxy resin. Each of these layers preferably has a thickness of about 50 μm.

Accordingly, the preferable thickness of intermediate layers each formed by layers 11-12, 14-15, 17-18, 110-111, and 116-117 are approximately 100 μm.

This forms spaces of approximately 100 μm between each adjacent two of signal layers 11 and 112 and ground layers 13, 19 and 115 because of the presence of epoxy resin prepreg.

FIG. 5 depicts layers 11, 12, 17 and 18 with hatching diagonally right up and layers 14, 15, 111, 116, and 117 with hatching diagonally right down. This is because layer 13 made of a copper foil and layers 14-15 are sometimes in the form of a single material; layer 19 made of a copper foil and layers 110-111 are sometimes in the form of a single material; and layer 115 made of a copper foil and layers 116-117 are sometimes in the form of a single material.

Layers 16 and 112 serving as signal layers L3 and L5 are made of copper, for example.

Layer 113-14 serving as intermediate layers are made of epoxy resin prepreg similarly to the remaining intermediate layer (i.e. layers 11-12, 14-15, 17-18, 110-111, and 116-117) but the resin prepreg material for layers 113-14 is a no-flow type or a low-flow type having a smaller coefficient of thermal expansion than those of the remaining intermediate layers.

In mounting electronic parts on the surface layer L20 of rigid board units 12a and 12b by soldering, multi-layer printed wiring board 11 is heated by a reflow process or the like. In this event, the presence of the space between rigid board units 12a and 12b causes layer 116 of flexible board unit 13 to be directly heated, so that heat concentrates on layers 113 and 114. For this reason, if layers 113 and 114 are formed of normal prepreg, layers 113 and 114 expand to peel off, crack or break the wiring.

As a solution, multi-layer printed wiring board 11 uses a material on which less heat concentrates than other materials for layers 113 and 114 which heat tends to expand due to heat concentration. It is thereby possible to prevent flexible board unit 13 from peeling off or cracking or prevent the wiring from being broken due to being excessively heated in the reflowing process.

In addition, adhesive layer 125 that is to be described below is made of the same material as layers 113 and 114.

Next, description will now be made in relation to the structures of rigid board units 12a and 12b and materials of layers thereof. The first embodiment assumes that rigid board units 12a and 12b have the same structure. Hereinafter, rigid board units 12a and 12b are referred to as rigid board unit 12 if there is no requirement for discrimination of rigid board units 12a and 12b from each other.

Rigid board unit 12 includes layers L7 through L20. Adhesive layer 125 also functions as rigid board unit 12.

Layers L7 (layer 118), L9 (layer 122), L12 (layer 128), L14 (layer 132), L16 (layer 136), and L18 (layer 140) of rigid board unit 12 serve as signal layers.

Layers 119, 121, 123, 127, 129, 131, 133, 135, 137, 139, 141, and 143 of rigid board unit 12 are formed by impregnating glass cloth with epoxy resin.

In addition, layers 120, 124, 126, 130, 134 138, and 142 of rigid board unit 12 are in the form of non-patterned layers made of a copper foil.

Reference numbers 19a-19d of FIG. 5 represent through-hole lands, and reference numbers 18a and 18b represent signal lines.

As described above, layer 125 serves as an adhesive layer and uses prepreg of a no-flow type as an adhesive.

In other words, multi-layer printed wiring board 11 is formed by bonding first multi-layer printed wiring board 11a including layers L1 through L10 and second multi-layer printed wiring board 11b including layers L11 through L20.

Multi-layer printed wiring board 11 depicted in FIG. 5 undergoes plating, solder resist, and rust prevention processes and others similar to conventional techniques.

As described above, in multi-layer printed wiring board 11 of electronic device 1 of the first embodiment, flexible board unit 13 has signal layers 16 and 112 respectively sandwiched by ground layers 13 and 19 and ground layers 19 and 115. Further, intermediate layers 14-15 and intermediate layers 17-18 are interposed respectively between ground layer 13 and signal layer 16 and between signal layer 16 and ground layer 19; and intermediate layers 110-111 and intermediate layers 113-114 are interposed respectively between ground layer 19 and signal layer 112 and between signal layer 112 and ground layer 115. With this configuration, there form spaces of approximately 100 μm resulting from the epoxy resin prepreg between signal layer 16 and each of ground layers 13 and 19 and between signal layer 112 and each of ground layers 19 and 115.

It is therefore possible for flexible board unit 13 of multi-layer printed wiring board 11 to control the impedance of signals transmitted through signal lines 14 for signal layers 16 and 112 at characteristic impedance, for example 50 Ω, while keeping the flexibility of flexible board unit 13. As a consequence, signals can be transmitted at a high speed between rigid board units 12 through signal lines 14 of signal layer 16 and 112. Specifically, the speed can be more than 1 GHz.

In addition, multi-layer printed wiring board 11 has a number of signal layers 16 and 112 (signal lines 14), keeping compatibility of flexibility with impedance control.

Specifically, since intermediate layers 14-15, 17-18, 110-111, and 113-114 are made of a material formed by impregnating ultra-thin glass cloth with epoxy resin, the flexibility of flexible board unit 13 can be maintained even if flexible board unit 13 is formed into a multi-layer structure to form plurality of signal line 14.

Flexible board unit 13 further includes protection layers 11-12 and 116-117 on the outer surface of ground layer 13 and 115, respectively. The presence of such protection layers makes it possible to more surely perform the above impedance control on signals.

Further, intermediate layers 113-114 that are adjacent to ground layer 115 that is the nearest to rigid board unit 12 among the layers of flexible board unit 13 is formed by a material having a smaller coefficient of thermal expansion than those of the materials of the remaining intermediate layers. Accordingly, when flexible board unit 13 on the side of rigid board units 12 is heated in the reflow process, thermal expansion at the portion inclined to expand the most can be avoided. Thereby, it is possible to inhibit breaking in the wiring caused by expansion of the materials of flexible board unit 13.

(b) Second Embodiment

Next, description will now be made in relation to the multi-layer printed wiring board 11' according to the second embodiment with reference to FIGS. 6 and 7.

Multi-layer printed wiring board 11' also forms electronic device 1 or plug-in unit 10 similarly to the first embodiment described above with reference to FIGS. 1-4.

Figure 6:
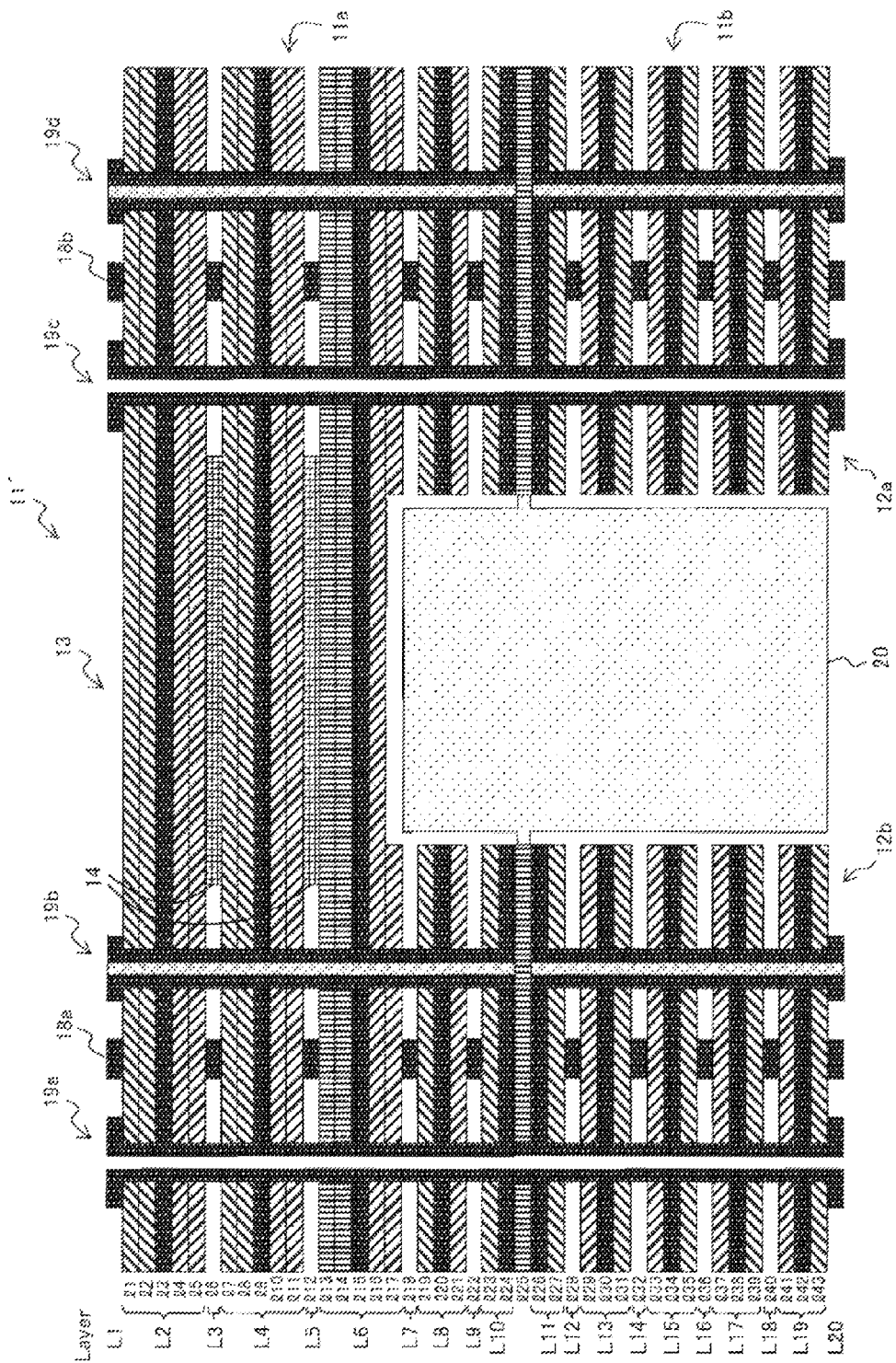
FIGS. 6 and 7 are sectional views illustrating a multi-layer printed wiring board according to a second embodiment.

As depicted in FIG. 6, multi-layer printed wiring board 11' is identical in structure with multi-layer printed wiring board 11 of the first embodiment except for the point of the inclusion of a dummy board unit (rigid dummy board unit) 20.

In other words, multi-layer printed wiring board 11' includes dummy board unit 20 that is arranged on the outer surface of flexible board unit 13 and between two rigid board units 12 and that is coupled to at least one of flexible board unit 13 and the rigid board units 12 at one or more (in this example two) portions.

Dummy board unit 20 is formed of the same materials as layers 118-143 that are arranged in parallel with the layers of dummy board unit 20.

Figure 7:
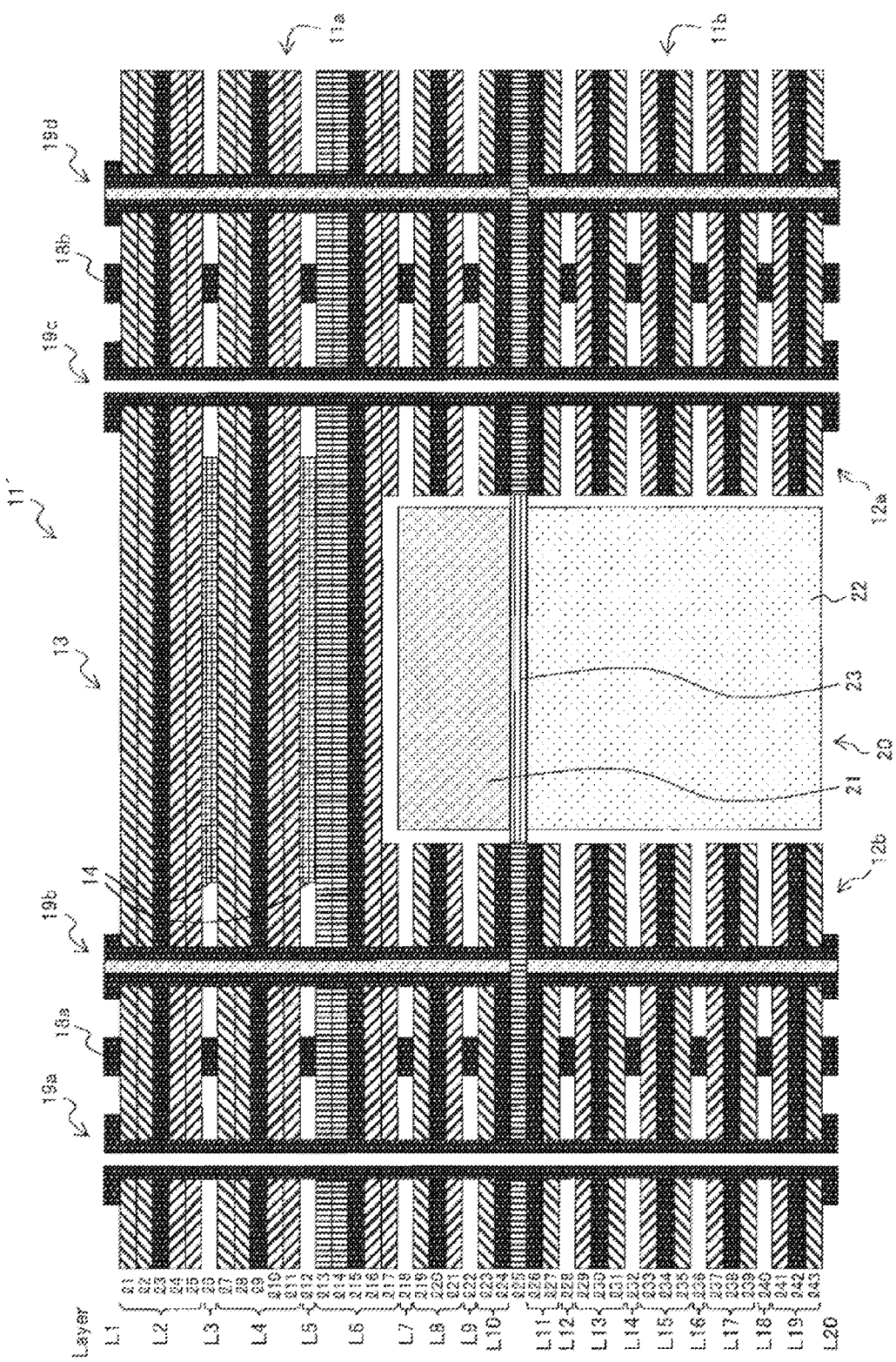

As depicted in FIG. 7, first dummy board unit 21 of dummy board unit 20 is fabricated in the form of one body to share with other units in fabrication of first multi-layer printed wiring board 11a by laminating and is then completed by slitting layers 124-118 in a slit process or the like. The slit from layer 124 to layer 118 is not formed on the entire surface of first multi-layer printed wiring board 1a but is formed such that the remaining portion of layers 124-118 is coupled to the other units (i.e., rigid board units 12). However, the remaining portion does not appear in FIGS. 6 and 7.

On the other hand, second dummy board unit 22 is fabricated in the form of one body to share with other units in fabrication of second multi-layer printed wiring board 11b by laminating and is then (in this example, after combining with first multi-layer printed wiring board 11a) separated from the other units by slitting layers 143-126 in the slit process or the like.

Dummy adhesive portion 23 is a pregreg that binds first multi-layer printed wiring board 11a after the slit process and second multi-layer printed wiring board 11b (i.e., rigid board units 12a and 12b and second dummy board unit 22 that are taking a single form) before the slit process, and are serving as adhesive layer 125.

In multi-layer printed wiring board 11' having first multi-layer printed wiring board 11a after the slit process and second multi-layer printed wiring board 11b before the slit process that are bound to each other by adhesive layer 125, slitting layers 143 through 126 forms dummy board unit 20 coupled to adhesive layer 125 of rigid board units 12a and 12b as depicted in FIG. 7.

Further, dummy board unit 20 of multi-layer printed wiring board 11' depicted in FIG. 6 is removed from multi-layer printed wiring board 11' after a heat treatment such as a reflow step in a soldering process that mounts one or more electronic parts on the part mounting surface (layer L20) of rigid board unit 12.

In other words, the method for fabricating electronic device 1 (10) according to the second embodiment includes a step of removing dummy board unit 20 from multi-layer printed wiring board 11' after a heat treatment in the soldering process that mounts one or more parts on rigid board unit 12 in multi-layer printed wiring board 11' including dummy board unit 20 depicted in FIG. 6.

As described above, the method for fabricating multi-layer printed wiring board 11' (electronic device 1 (10)) according to the second embodiment can prevent flexible board unit 13 from being directly exposed to the heat resulting from reflow soldering to mount parts, so that it is possible to eliminate the possibility of thermal expansion of flexible board unit 13. As a consequence, it is surely possible to prevent layers in flexible board unit 13 from peeling off or cracking, and to prevent the wiring from breaking. That can surely fabricate multi-layer printed wiring board board 11'.

(c) Others:

The present invention should by no means be limited to the foregoing embodiments, and various changes and modifications can be suggested without departing from the spirit of the present invention.

For example, electronic device 1 of the above embodiments is exemplified by an apparatus accommodating a number of plug-in units 10, but is not limited to this. A satisfactory electronic device 1 includes multi-layer printed wiring board 11 or 11'.

Figure 8A:
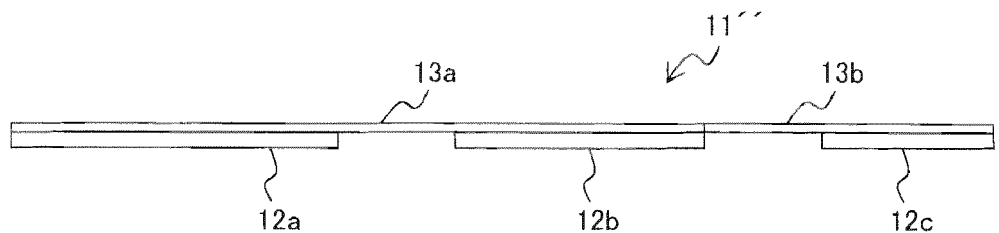
FIGS. 8A and 8B are a side view and a plain view depicting modifications of a multi-layer printed wiring board respectively.
Figure 8B:
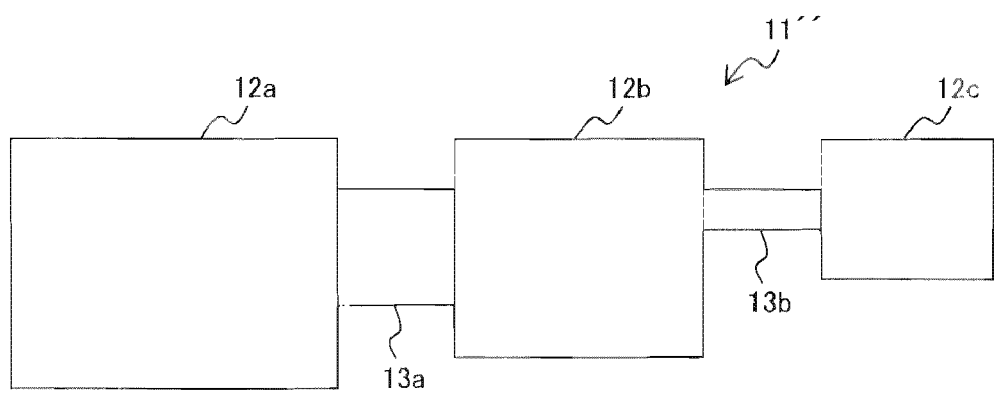
Figure 8C:
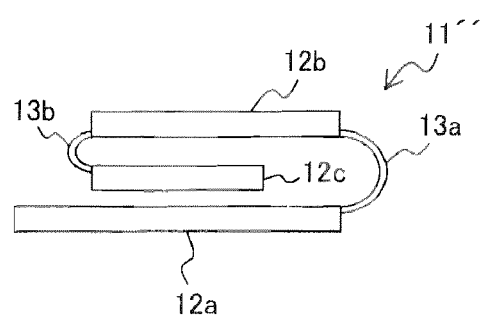
FIG. 8C is a side view showing an example of assembly of a multi-layer printed wiring board depicted in FIGS. 8A and 8B.

Multi-layer printed wiring boards 11 and 11' of the above embodiments each include two rigid board units 12a and 12b, to which the present invention is not limited. For example, as depicted in FIGS. 8A-8C, multi-layer printed wiring board 11" may include three or more (in this example, three) rigid board units 12a-12c. In this case, rigid board units 12a and 12b are connected by first flexible board unit 13a and rigid board units 12b and 12c are connected by second flexible board unit 13b.

The methods for fabricating and laminating rigid board units 12a-12c and the first and second flexible board units 13a, 13b are identical to those of the foregoing embodiments.

As illustrated in FIG. 8C, rigid board units 12a-12c of multi-layer printed wiring board 11" are connected by spacers so as to form a three-layer structure. That makes multi-layer printed wiring board 11" higher in integration and smaller in size than multi-layer printed wiring boards of the foregoing embodiments.

The above first and second embodiment assume that flexible board unit 13 connects the outer surfaces of a number of rigid board units 12 and extends over the outer surface of the rigid board units 12. However, the present invention is not limited to this structure. Alternatively, flexible board unit 13 may extend over the portions of one or more of the rigid board units and connect all the rigid board units 12. That can secure the same advantages as the foregoing embodiments.

If flexible board unit 13 is formed between the inner layers of one or the both of rigid board units 12, it is preferable that two dummy board units 20 are formed on both sides of flexible board unit 13. That further ensures the advantages of the second embodiment.

In the above two embodiments, rigid board units 12a and 12b are the same in the number of layers, but the present invention is not limited to this. Rigid board units 12 may differ in the number of layers.

Further, intermediate layers 11-12, 14-15, 17-18, 110-111, 113-114, and 116-117, and layers 119, 121, 123, 127, 129, 131, 133, 135, 137, 139, 141, and 143 of rigid board units 12a and 12b are assumed to be a material formed by impregnating ultra-thin glass cloth with epoxy resin without using glass cloth. However, the materials of the intermediate layers and other layers are not limited to this. Alternatively, a material formed by laminating a copper foil onto epoxy resin or a nonwoven glass fabric material (e.g., a composite copper-clad laminate board) may be used. Further alternatively, these layers may be formed by a combination of these materials. These alternatives can derive the same effects as the above embodiments.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A multi-layer printed wiring board comprising:
   a plurality of rigid board units; and
   a flexible board unit, connecting outer layers or inner layers of said plurality of rigid board units and extending over the outer layers or the inner layers of said plurality of rigid board units, said flexible board unit comprising
   a signal layer sending signals between said plurality of rigid board units;
   ground layers sandwiching said signal layer; and
   intermediate layers each interposed between said signal layer and one of said ground layers,
   wherein, when said flexible board unit is formed on the outer layers of said plurality of rigid board units, one of said intermediate layer adjacent to one of said ground layers that is arranged the nearest to said plurality of rigid board units being made of a material having a smaller coefficient of thermal expansion than those of the remaining intermediate layers.

2. The multi-layer printed wiring board according to claim 1, said flexible board unit further comprising a plurality of said signal layers each of which is sandwiched by sets of said intermediate layer and ground layer.

3. The multi-layer printed wiring board according to claim 1, further comprising three or more of said rigid board units connected to said flexible board unit.

4. The multi-layer printed wiring board according to claim 1, said flexible board further comprising a protection layer laminated on an outer surface of each of said ground layers.

5. The multi-layer printed wiring board according to claim 1, each of said intermediate layers comprising a material formed by impregnating glass cloth with epoxy resin.

6. The multi-layer printed wiring board according to claim 1, each of said intermediate layers comprising a material epoxy resin and each of said ground layers comprising a material of a copper foil and said intermediate layers and said ground layers laminating together.

7. The multi-layer printed wiring board according to claim 1, each of said intermediate layers comprising a nonwoven grass fabric material.

8. The multi-layer printed wiring board according to claim 5, each said intermediate layer being formed by laminating the material a number of times.

9. The multi-layer printed wiring board according to claim 6, each said intermediate layer being formed by laminating the material a number of times.

10. The multi-layer printed wiring board according to claim 7, each said intermediate layer being formed by laminating the material a number of times.

11. A multi-layer printed wiring board according to claim 1, further comprising a rigid dummy rigid board unit that is arranged on the outer layer of said flexible board unit and between two of said plurality of rigid board units and that is coupled to at least one of said flexible board unit and said two rigid boards at least one portion.

12. An electronic device comprising a multi-layer printed board comprising:
   a plurality of rigid board units; and
   a flexible board unit, connecting outer layers or inner layers of said plurality of rigid board units and extending over the outer layers or the inner layers of said plurality of rigid board units, said flexible board unit comprising
      a signal layer sending signals between said plurality of rigid board units;
      ground layers sandwiching said signal layer; and
      intermediate layers each interposed between said signal layer and one of said ground layers,
   wherein, when said flexible board unit is formed on the outer layers of said plurality of rigid board units, one of said intermediate layer adjacent to one of said ground layers that is arranged the nearest to said plurality of rigid board units being made of a material having a smaller coefficient of thermal expansion than those of the remaining intermediate layers.

* * * * *